(12) United States Patent
Ishikawa

(10) Patent No.: US 6,937,081 B2
(45) Date of Patent: Aug. 30, 2005

(54) DELAY PRODUCING METHOD, DELAY ADJUSTING METHOD BASED ON THE SAME, AND DELAY PRODUCING CIRCUIT AND DELAY ADJUSTING CIRCUIT APPLIED WITH THEM

(75) Inventor: Toru Ishikawa, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/714,768

(22) Filed: Nov. 17, 2003

(65) Prior Publication Data

US 2004/0201409 A1 Oct. 14, 2004

(30) Foreign Application Priority Data

Nov. 18, 2002 (JP) ........................................ 2002-333161

(51) Int. Cl.[7] .............................................. H03K 5/153
(52) U.S. Cl. ....................................... 327/276; 327/261
(58) Field of Search ................................ 327/158, 261, 327/276–278

(56) References Cited

U.S. PATENT DOCUMENTS

| | | | | |
|---|---|---|---|---|
| 4,852,035 A | * | 7/1989 | Michener | 708/313 |
| 5,374,860 A | * | 12/1994 | Llewellyn | 327/276 |
| 5,561,692 A | * | 10/1996 | Maitland et al. | 375/371 |
| 5,784,378 A | * | 7/1998 | Murray et al. | 370/498 |
| 6,025,744 A | * | 2/2000 | Bertolet et al. | 327/276 |
| 6,285,229 B1 | * | 9/2001 | Chu et al. | 327/277 |
| 6,369,627 B1 | | 4/2002 | Tomita | 327/158 |
| 6,674,314 B2 | * | 1/2004 | Takai | 327/158 |

FOREIGN PATENT DOCUMENTS

| | | | | |
|---|---|---|---|---|
| JP | 2001-056723 | | 2/2001 | G06F/1/10 |
| JP | 2001-111394 | | 4/2001 | H03K/5/135 |

OTHER PUBLICATIONS

"A 1–Gb/s/pin 512–Mb DDRII SDRAM Using a Digital DDL and a Slew–Rate–Controlled Output Butter" Matano et al., Article, 3 pgs.

* cited by examiner

*Primary Examiner*—Dinh T. Le
(74) *Attorney, Agent, or Firm*—Hayes Soloway P.C.

(57) ABSTRACT

A delay adjusting circuit that can minimize a delay at selectors even when the number of delay stages and the number of selector stages are increased, to enable a stable and speedy operation. As selectors S in a delay producing circuit (11), 2:1 selectors, each of the type that selectively outputs one from two inputs, may be used which are connected to input/output portions of N-stage delay elements D1 to DN for enabling delayed output of an even-stage delayed clock signal (Even) and an odd-stage delayed clock signal (Odd). In this case, the 2:1 selectors are arranged in a two-stage configuration including the for-even-stage selectors (S1, S3, . . . , Sn, S(n+2)) and the for-odd-stage selectors (S2, . . . , S(n+1), S(n+3)). The even-stage delayed clock signal (Even) is obtained through the first-stage selector S1. The odd-stage delayed clock signal (Odd) is obtained through the second-stage selector S2.

7 Claims, 5 Drawing Sheets

US 6,937,081 B2

DELAY PRODUCING METHOD, DELAY ADJUSTING METHOD BASED ON THE SAME, AND DELAY PRODUCING CIRCUIT AND DELAY ADJUSTING CIRCUIT APPLIED WITH THEM

BACKGROUND OF THE INVENTION

The present invention relates to a delay producing method applied to, for example, a DLL (Digital Locked Loop) circuit or the like mounted in a semiconductor integrated circuit or the like, and a delay adjusting method according thereto, and further relates to a delay producing circuit and a delay adjusting circuit applied with them, respectively.

A technology relating to delay production with respect to digital signals is disclosed in, for example, JP-A-2001-56723 or JP-A-2001-111394.

FIGS. 1A and 1B are diagrams for explaining a basic function of a conventional delay adjusting circuit configured by employing a delay circuit disclosed in JP-A-2001-56723. Incidentally, this delay adjusting circuit is also described in a thesis "2002 VLSI Symposium Thesis No. 9-1 A1-Gb/s/pin 512-Mb DDRII SDR AM using a digital DLL and a slew-rate-controlled output buffer; Tatsuya Matano et al.".

This delay adjusting circuit includes first-stage to $N^{th}$ stage delay elements connected in series to each other and inputted with a clock signal (CLK Input). The delay elements are shown as D1, D2, . . . , Dn, D(n+1), . . . , DN in a multi-stage structure, wherein N>n, n is a natural number no less than four, and N is a natural number no less than seven.

The clock signal is inputted (CLK Input) to an input side of the first-stage delay element D1. In this state, a delay producing circuit 10 outputs an even-stage delayed signal (Even) and an odd-stage delayed signal (Odd) by an operation of a selector S. A delay fine adjusting circuit 2 synthesizes the even-stage delayed signal and the odd-stage delayed signal and gives a fine adjustment thereto to thereby produce and output an internal clock signal (Internal CLK).

For example, FIG. 2 shows a DLL circuit wherein an initial stage circuit 3 is connected in series to an input side of a delay adjusting circuit 1, and a phase comparing circuit 4 is connected in parallel to an input side of the initial stage circuit 3 and an output side of the delay adjusting circuit 1. In this DLL circuit, assuming that the DLL is locked in one period, it is necessary that a minimum value of the total delay amount i.e., the sum of a delay amount of the initial circuit 3 and a delay amount of the delay producing circuit 10 of the delay adjusting circuit 1, be no more than one period. In the foregoing thesis, the delay of the DLL circuit is set to two periods for coping with a high-speed operation. However, when the delay is large, the number of delay elements increases and a delay variation due to power supply noise becomes large which increases jitter amount. Therefore it is desirable that the DLL be locked with a delay of one period. Even if the DLL circuit is configured that the DLL is locked with a delay of two periods, when the operation is further speeded up, it is necessary to reduce the delay of the DLL circuit itself.

As a preferred example of a delay producing circuit of the delay adjusting circuit 1, the foregoing thesis describes a structure wherein an even-stage delayed signal and an odd-stage delayed signal are selected from delays of 256 stages. When the delay producing circuit is configured by using 4:1 selectors, each selector selecting one out of four inputs to output, so that delays from the 256-stage delays are selected, a hierarchical structure is obtained as schematically shown in FIG. 3. Herein the delays are grouped per four stages, and each 4:1 selector selects one from four-stage delays.

In the foregoing delay adjusting circuit, for the purpose of fully coping with an increase in operation frequency required for DLL circuits in recent years, it is necessary to increase the number of delay stages in the delay producing circuit. However, there has been a problem that when the number of delay stages increases, the number of stages (total number) of selectors also increases, and this total number of the selectors causes an operation slowdown for delay adjustment. For example, in the structure shown in FIG. 3, 256-stage delays are grouped per four stages and the 4:1 selectors are used. Although the output of the final stage is one an engineer skilled in circuit design would recognize that when 256 transistors are used for delayed output, electrical loads are added to power the selectors thereby slowing the basic operation of the DLL circuit.

SUMMARY OF THE INVENTION

It is therefore an object of the present invention to provide a delay producing method that can minimize a delay at selectors even when the number of delay stages and the number of selector stages are increased, to thereby enable a stable and speedy operation.

It is another object of the present invention to provide a delay adjusting method based on the foregoing delay producing method.

It is still another object of the present invention to provide a delay producing circuit that can minimize a delay at selectors even when the number of delay stages and the number of selector stages are increased, to thereby enable a stable and speedy operation.

It is still another object of the present invention to provide a delay adjusting circuit including the foregoing delay producing circuit.

According to one aspect of the present invention, there is provided a delay producing method using first-stage to $N^{th}$ stage delay elements connected in series to each other and, when a clock signal is inputted to an input side of the first-stage delay element, producing an even-stage delayed signal from a clock signal obtained from the even-stage delay element, and an odd-stage delayed signal from a clock signal obtained from the odd-stage delay element. The delay producing method comprises using first-stage and second-stage to $N^{th}$ stage selectors arranged in one-to-one correspondence with the delay elements, and each outputting one selected from two inputs, using, as one of inputs to each of the first-stage to $N^{th}$ stage selectors, an input to a corresponding one of the delay elements, using, as the other of the inputs to each of the first-stage to $(N-1)^{th}$ stage selectors, an output from the selector of the next but one stage, outputting the even-stage delayed signal from the first-stage selector, and outputting the odd-stage delayed signal from the second-stage selector.

According to another aspect of the present invention, there is provided a delay adjusting method based on the above-mentioned delay producing method comprising the steps of synthesizing the even-stage delayed clock signal and the odd-stage delayed clock signal with each other and applying a fine adjustment thereto to thereby produce and output an internal clock signal.

According to still another aspect of the present invention, there is provided a delay producing circuit including first-stage to $N^{th}$ stage delay elements connected in series to each other and, when a clock signal is inputted to an input side of the first-stage delay element, producing an even-stage delayed signal from a clock signal obtained from the even-stage delay element, and an odd-stage delayed signal from a clock signal obtained from the odd-stage delay element. The delay producing circuit comprises first-stage and second-stage to $N^{th}$ stage selectors arranged in one-to-one correspondence with the delay elements, and each having two input terminals and one output terminal. In the delay producing circuit, one of the input terminals of each of the first-stage to $N^{th}$ stage selectors is connected to an input side of a corresponding one of the delay elements, the other of the input terminals of each of the first-stage to $(N-1)^{th}$ stage selectors is connected to the output terminal of the selector of the next but one stage, the even-stage delayed signal is outputted from the output terminal of the first-stag selector, and the odd-stage delayed signal is outputted from the output terminal of the second-stage selector.

According to a yet another aspect of the present invention, there is provided a delay adjusting circuit using the above-mentioned delay producing circuit, comprising a delay fine adjusting circuit that synthesizes the even-stage delayed clock signal and the odd-stage delayed clock signal with each other and applies a fine adjustment thereto to thereby produce and output an internal clock signal.

According to still another aspect of the present invention, there is provided a delay producing circuit comprising $N^{th}$ stage delay elements connected in series to each other, and selectors that, in the state where a clock signal is inputted to an input side of the first-stage delay element, switchingly select delays of the given delay elements from input/output portions of the $N^{th}$ stage delay elements in response to a switching control signal from an external control circuit, thereby to output an even-stage delayed clock signal and an odd-stage delayed clock signal. In the delay producing circuit, the selectors are 2:1 selectors each of the type that selectively outputs one from two inputs, and include for-even-stage selectors connected in series to each other so as to successively receive, as one input sequence, an output from the input side of the first-stage delay element, and outputs from output sides of the second-stage to $(N-1)^{th}$ stage delay elements, the outputs each received from every other one of the input/output portions of the $N^{th}$ stage delay elements, and further receive, as the other input sequence, outputs from the second-stage and subsequent selectors at the prior-stage selectors, respectively, thereby to enable the even-stage delayed clock signal obtained by the selector of the stage switchingly selected by the switching control signal, to be outputted through the first-stage selector, and further include for-odd-stage selectors connected in series to each other so as to successively receive, as one input sequence, an output from an output side of the first-stage delay element, and outputs from output sides of the third-stage to $N^{th}$ stage delay elements, the outputs each received from every other one of the input/output portions of the $N^{th}$ stage delay elements, and further receive, as the other input sequence, outputs from the second-stage and subsequent selectors at the prior-stage selectors, respectively, thereby to enable the odd-stage delayed clock signal obtained by the selector of the stage switchingly selected by the switching control signal, to be outputted through the first-stage selector.

DESCRIPTION OF THE PREFERRED EMBODIMENT

Figure 4:
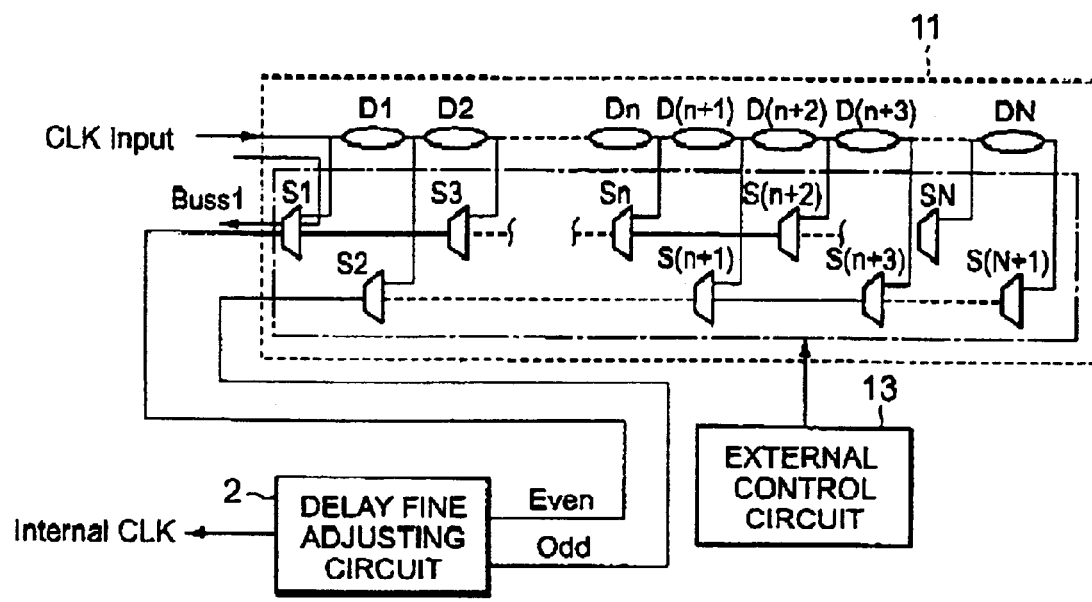
FIG. 4 is a block diagram showing a basic structure of a delay adjusting circuit including a delay producing circuit according to a preferred embodiment of the present invention.

Referring to FIG. 4, a delay adjusting circuit including a delay producing circuit according to a preferred embodiment of the present invention is described.

A delay producing circuit 11 includes first-stage to $N^{th}$ stage delay elements D1, D2, . . . , D(n-1), Dn, D(n+1), D(n+2), . . . , DN connected in series to each other, and first-stage and second-stage to $N^{th}$ stage selectors S1, S2, S3, Sn, S(n+1), S(n+2), S(n+3), . . . , SN that are in one-to-one correspondence with the delay elements D1 to DN. Each of the selectors S1 to SN has two input terminals and one output terminal.

One of the input terminals of each of the selectors S1 to S(N-1) is connected to an input side of a corresponding one of the delay elements D1 to DN. The other of the input terminals each of the selectors S1 to S(N-1) is connected to the output terminal of the selector of the next plus one stage.

One of the input terminals of the $N^{th}$ stage selector SN is connected to an input side of the $N^{th}$ stage delay element DN. The other of the input terminals of the $N^{th}$ stage selector SN is omitted. In this event, the $N^{th}$ stage select SN will be referred to a specific selector.

The delay producing circuit 11 further includes $(N+1)^{th}$ stage selector S(N+1). One of the input terminals of the $(N+1)^{th}$ stage selector S(N+1) is connected to an output side of the $N^{th}$ stage delay element DN. The other of the input terminals of the $(N+1)^{th}$ stage selector S(N+1) is omitted. In this event, the $(N+1)^{th}$ stage selector S(N+1) will be called a particular selecter.

Each of the selectors S1 to S(N+1) switchingly selects a delay of the corresponding delay element according to a switching control signal from an external control circuit 13. In a multi-stage structure of the delay producing circuit 11 shown in FIG. 4, N>n, n is a natural number no less than four, and N is a natural number no less than seven.

A clock signal is inputted (CLK Input) to the input side of the first-stage delay element D1. Responsive to the clock signal, the delay producing circuit 11 produces an even-stage delayed signal (Even) from a clock signal obtained from the even-stage delay element, and an odd-stage delayed signal (Odd) from a clock signal obtained from the odd-stage delay element. Specifically, the even-stage delayed signal is outputted from the output terminal of the first-stage selector S1, and the odd-stage delayed signal is outputted from the output terminal of the second-stage selector S2.

The even-stage delayed signal and the odd-stage delayed signal from the delay producing circuit 11 are fed to a delay fine adjusting circuit 2 where they are synthesized with each other, given a fine adjustment, and outputted as an internal clock signal.

Description will be further given about the selectors S1 to S(N+1).

Each of the selectors S1 to S(N+1) is a 2:1 selector of the type that selectively outputs one signal from two inputs. One input terminal of the selectors S1 to S(N+1) are respectively connected to the input side of the first-stage delay element D1, an output side of the second-stage delay element D2, . . . , an output side of the $(n-1)^{th}$ delay element D(n-1), an output side of the $(n+1)^{th}$ delay element D(n+1), . . . , and an output side of the $(N-1)^{th}$ delay element D(N-1). The other input terminals of selectors S1 to S(N+1) are each connected to the output terminal of the selector of the next plus one stage.

Further, the delay producing circuit 11 is configured such that delay amounts of the first-stage to $N^{th}$ stage delay elements are equal to each other, and the total number of the selectors S1, S3, Sn, . . . for even stages, and the selectors S2, S(n+1), . . . for odd stages becomes N+1 or less.

The delay producing circuit 11 in the delay adjusting circuit employs a two-stage selector configuration wherein the 2:1 selectors are used as the for-even-stage selectors and the for-odd-stage selectors, to thereby enable delayed output of the even-stage delayed signal and the odd-stage delayed signal. For example, if the $n^{th}$ stage selector Sn is the for-even-stage selector and has inputs that are an output of the $(n)^{th}$ stage delay element D(n) and an output of the $(n+2)^{th}$ stage selector S(n+2), and if the $(n+1)^{th}$ stage selector S(n+1) is the for-odd-stage selector and has inputs that are an output of the $n^{th}$ stage delay element D(n+1) and an output of the $(n+3)^{th}$ stage selector S(n+3). With this configuration, the even-stage delayed signal being the first output can be obtained through the first-stage selector S1, and the odd-stage delayed signal being the second output can be obtained through the second-stage selector S2.

When the selectors are arranged in the two-stage selector configuration as described above, the shortest delay path in the delay adjusting circuit in FIG. 4 is a path 1 for feeding the input clock signal (CLK Input) to the selector S1 being the for-even-stage selector from the input side of the delay element D1. Therefore, the smallest delay can be achieved only with a delay of the first-stage selector S1. Even if delays of the other delay elements D2 to DN are added, these are only added successively and do not influence the smallest delay obtained by the shortest delay path.

Figure 5:
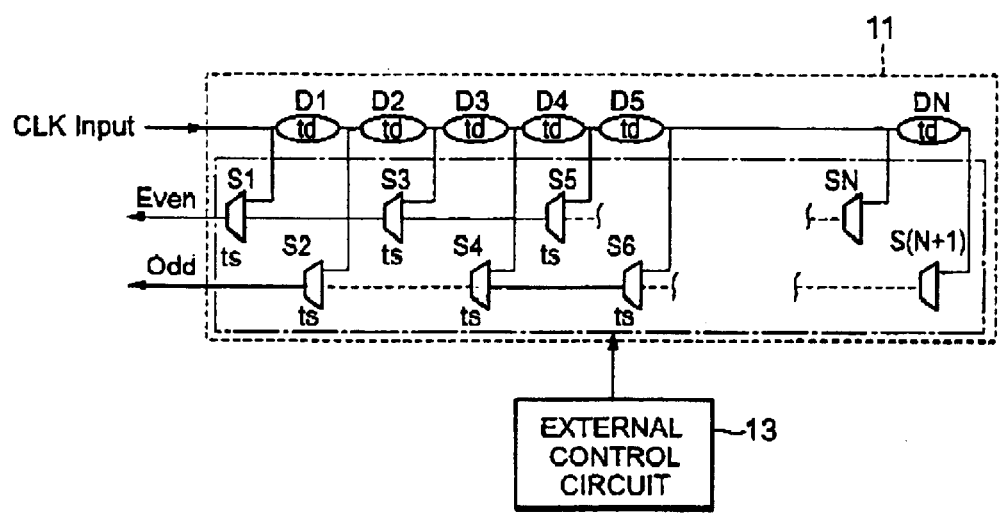
FIG. 5 is a block diagram for explaining a delay operation in the delay producing circuit provided in the delay adjusting circuit shown in FIG. 4.

Referring to FIG. 5, a delay operation in the delay producing circuit 11 will be described.

It is hereby assumed that a delay amount (delay value) of each of the delay elements D1 to DN is td, a delay amount (delay value) of each of the selectors S1 to S(N+1) is ts, and a switching time of the input clock signal (CLK Input) is 0 ns.

In the basic operation, an even-stage delayed clock signal (Even) and an odd-stage delayed clock signal (Odd) are outputted from the delay producing circuit 11. It is assumed that the delay adjusting circuit including the delay producing circuit 11 is applied to a DLL circuit. If a locking position of the DLL is delayed when delays of the delay elements Dn and D(n+1) are selected at the selectors S(n+1) and S(n+2), respectively, by a switching control signal from the exterior, then the delay elements D(n+2) and D(n+1) are selected by the selectors S(n+3) and S(n+2), respectively, by a switching control signal from the exterior, then the delay elements D(n+2) and D(n+3) are selected by the selectors S(n+3) and S(n+4), respectively, by a switching control signal from the exterior, and then likewise, so that an even-stage delayed signal and an odd-stage delayed signal are switched alternately therebetween.

In this event, at the outset, the first-stage selector S1 of the for-even-stage selectors and the first-stage selector S2 of the for-odd-stage selectors select the delay element side (side A), while the other selectors S3 to S6 select the selector output side (side B). As a result, a delay of an even-stage delayed signal becomes ts, and a delay of an odd-stage delayed signal becomes ts+td.

Then, the first-stage selector S2 of the for-odd-stage selectors and the second-stage selector S3 of the for-even-stage selectors select the delay element side (side A), while the other selectors S1 and S4 to S6 select the selector output side (side B). As a result, a delay of an even-stage delayed signal becomes 2ts+2td, and a delay of an odd-stage delayed signal becomes ts+td.

Further, the second-stage selector S3 of the for-even-stage selectors and the second-stage selector S4 of the for-odd-stage selectors select the delay element side (side A), while the other selectors S1, S2, S5, and S6 select the selector output side (side B). As a result, a delay of an even-stage delayed signal becomes 2ts+2td, and a delay of an odd-stage delayed signal becomes 2ts+3td.

Subsequently, the second-stage selector S4 of the for-odd-stage selectors and the third-stage selector S5 of the for-even-stage selectors select the delay element side (side A), while the other selectors S1 to S3 and S6 select the selector output side (side B). As a result, a delay of an even-stage delayed signal becomes 3ts+4td, and a delay of an odd-stage delayed signal becomes 2ts+3td.

As described above, in the foregoing delay adjusting circuit, the delays of the even-stage delayed signal and the odd-stage delayed signal are alternately changed. A delay difference therebetween becomes td or td+ts. Normally, td is dominant over ts (i.e. td>ts). Therefore, the delay difference becomes nearly constant.

Figure 1A:
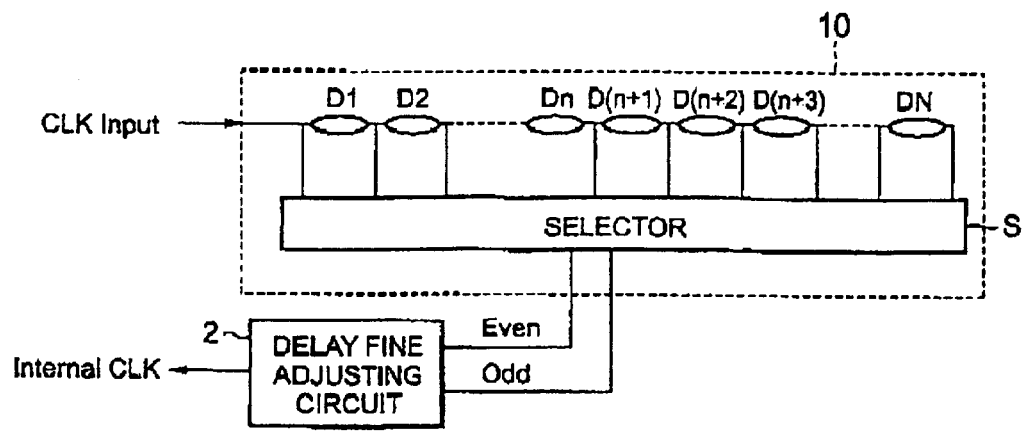
FIG. 1A is a block diagram for explaining a basic function of a conventional delay adjusting circuit.
Figure 1B:
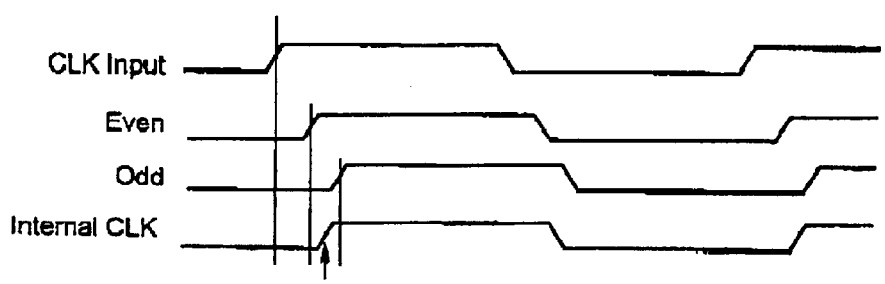
FIG. 1B is a timing chart showing waveforms of respective signals in the delay adjusting circuit shown in FIG. 1A.
Figure 2:
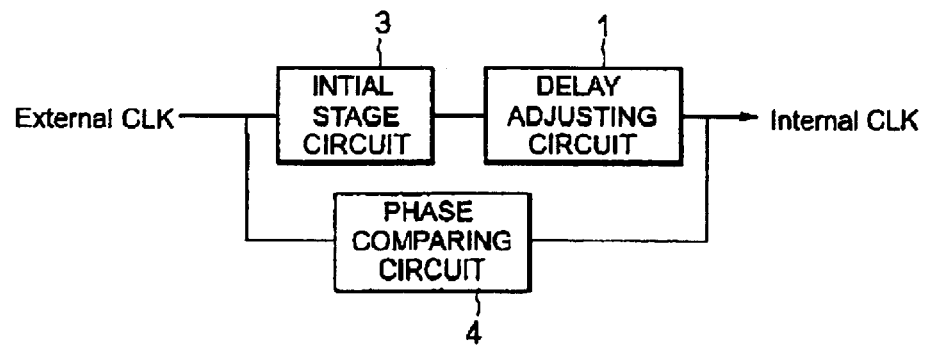
FIG. 2 is a block diagram of a DLL circuit including the delay adjusting circuit shown in FIG. 1A.
Figure 3:
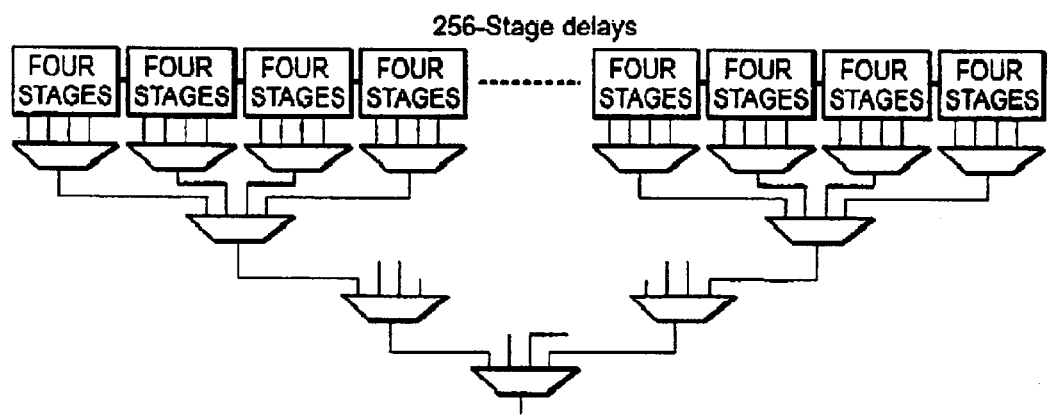
FIG. 3 is a schematic diagram of a delay producing circuit in the delay adjusting circuit applied to the DLL circuit shown in FIG. 2.

It is assumed that the foregoing delay adjusting circuit is applied to the DLL circuit shown in FIG. 2. In this case, if it is attempted to cover a low speed up to about 10 ns, the number of stages of delay elements becomes large. In case of N stages, a delay of the initial circuit 3+N×td+N×ts is a maximum value for locking the DLL circuit. If a larger delay is required, it is necessary to increase the number of stages (total number) of delay elements.

On the other hand, resolution required for the DLL circuit may be lower at low periods. Accordingly, although the delay amounts td of the delay elements Dl to DN are equal to each other, in the foregoing embodiment, they may have different delays.

Figure 6:
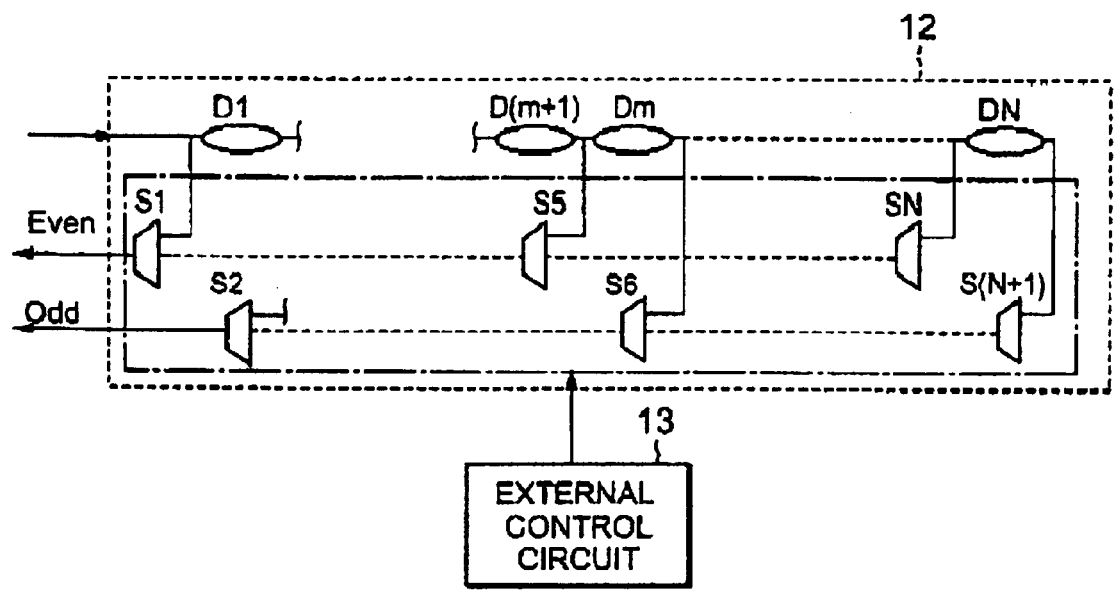
FIG. 6 is a block diagram showing another delay producing circuit applicable to the delay adjusting circuit shown in FIG. 4.

Referring to FIG. 6, description will be given about another delay producing circuit 12 applicable to the foregoing delay adjusting circuit Combined with the delay fine adjusting circuit 2 shown in FIG. 4, the delay producing circuit 12 also constitutes a delay adjusting circuit. In this embodiment, delay elements D1 to D(m−1) each have an equal delay amount, and the other delay elements Dm to DN each have an equal delay amount that differs from and is longer than the delay amount of each of the delay elements D1 to D(m−1).

By configuring the delay producing circuit 12 so that the delay elements have different delay amounts, it is possible to also cope with the low periods without increasing the number of stages (total number) of the delay elements. Incidentally, although the description has been given about the case where the delay elements have two kinds of delay amounts, the delay elements may also have three or more kinds of delay amounts.

According to the delay adjusting circuit described above, the minimum value of the delay can be set to only the delay amounts of each selector to thereby achieve high-speed operation. Further, the delay elements and the selectors can be configured in one-to-one correspondence with each other so the minimum value of the delay has no influence. Therefore, even if the number of delay stages and the number of selector stages are increased, the delay at the selectors can be minimized to enable the stable and speedy operation. Further, by configuring the delay elements to have different delay amounts in the delay producing circuit, it is possible to also deal with the low periods without increasing the number of stages (total number) of the delay elements.

What is claimed is:

1. A delay producing method which uses first-stage to $N^{th}$ stage delay elements connected in series to each other and which, when a clock signal is inputted to a first delay stage node of said first-stage delay element, said delay producing method produces the clock signal through the first delay stage node and delayed signals outputted through second to $(N+1)^{th}$ delay stage nodes of the second through the $N^{th}$ delay elements, respectively, said delay producing method for producing an even clock signal and an odd clock signal comprising:

using a first-stage selector and second-stage to $(N+1)^{th}$ stage selectors arranged in one-to-one correspondence with said first delay stage node to $(N+1)^{th}$ delay stage nodes, and each of the first through the $(N+1)^{th}$ stage selectors outputting one selected from two inputs;

using, as one of inputs given to each of said first-stage selector to $(N+1)^{th}$ stage selector, an input given to a corresponding one of said first delay stage node to the $(N+1)^{th}$ delay stage nodes;

using, as the other of inputs given to each of said first-stage selector and the second-stage to $(N+1)^{th}$ stage selectors, an output from $(n+2)^{th}$ one of the third through $(N+1)$ stage selectors, where n is a variable between 1 and $(N-1)$: outputting said even clock signal from said first-stage selector; and outputting said odd clock signal from said second-stage selector.

2. The delay producing method according to claim 1, wherein delay amounts of said first-stage to $N^{th}$ delay elements are equal to each other.

3. The delay producing method according to claim 1, wherein said first-stage to $N^{th}$ stage delay elements are divided into a first group of the first through m-th stage delay elements and a second group of the (m+1)-th through N-th stage delay elements, where m is an integer smaller than N;

the first group of the first through m-th stage delay elements having delay amounts different from the second group of the (m+1)-th through N-th stage delay elements.

4. A delay producing circuit including first-stage to $N^{th}$ stage delay elements connected in series to each other and, when a clock signal is input to a first delay stage node of said first-stage delay element, producing the clock signal through the first delay stage node and delayed signals outputted through second to $(N+1)^{th}$ delay stage nodes of the second through the $N^{th}$ delay elements, respectively, the delay producing circuit being for producing an even clock signal and an odd clock signal and comprising:

a first-stage selector and second-stage to $(N+1)^{th}$ stage selectors arranged in one-to-one correspondence with said first delay stage node to $(N+1)^{th}$ delay stage nodes, and each of the first through the $(N+1)^{th}$ stage selectors having two input terminals and one output terminal;

wherein one of the input terminals of the first-stage selector is connected to the first delay stage node of the first-stage delay element while one of the input terminals of the second-stage through $(N+1)^{th}$ stage selectors is connected to the second through $(N+1)^{th}$ delay stage nodes, respectively;

wherein the other of the input terminals of the first through the $(N+1)^{th}$ stage selectors is connected to the output terminal of $(n+2)^{th}$ one of the third through the $(N+1)^{th}$ stage selectors, where n is a variable between 1 and $(N-1)$;

wherein the first-stage selector produces the even clock signal through the one output terminal of the first-stage selector while the second-stage selector produces the odd clock signal through the one output terminal of the second-stage selector.

5. The delay producing circuit according to claim 4, wherein delay amounts of said first-stage to $N^{th}$ stage delay elements are equal to each other.

6. The delay producing circuit according to claim 4, wherein said first-stage to $N^{th}$ stage delay elements are divided into a first group of the first through m-th stage delay elements and a second group of the $(m+1)^{th}$ through $N^{th}$ stage delay elements, where m is an integer smaller than N:

the first group of the first through $m^{th}$ stage delay elements having delay amounts different from the second group of the $(m+1)^{th}$ through $N^{th}$ stage delay elements.

7. The delay producing circuit according to claim 4, further comprising a delay fine adjusting circuit that synthesizes the even clock signal and the odd clock signal with each other and applies a fine adjustment thereto to produce and output an internal clock signal.

* * * * *